(12) United States Patent
Chen et al.

(10) Patent No.: US 11,360,595 B2
(45) Date of Patent: Jun. 14, 2022

(54) TOUCH DISPLAY DEVICE

(71) Applicant: Au Optronics Corporation, Hsinchu (TW)

(72) Inventors: Guan-Wu Chen, Hsinchu (TW); Chun-Yen Kuo, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 62 days.

(21) Appl. No.: 17/037,761

(22) Filed: Sep. 30, 2020

(65) Prior Publication Data

US 2021/0397284 A1 Dec. 23, 2021

(30) Foreign Application Priority Data

Jun. 18, 2020 (TW) ................................ 109120526

(51) Int. Cl.
| | | |
|---|---|---|
| *G06F 3/041* | (2006.01) | |
| *G06F 3/044* | (2006.01) | |
| *H01L 27/15* | (2006.01) | |
| *H01L 33/48* | (2010.01) | |
| *H01L 33/62* | (2010.01) | |
| *H01L 25/075* | (2006.01) | |
| *H01L 25/16* | (2006.01) | |

(52) U.S. Cl.
CPC .......... *G06F 3/0412* (2013.01); *G06F 3/0445* (2019.05); *H01L 27/156* (2013.01); *H01L 33/486* (2013.01); *H01L 33/62* (2013.01)

(58) Field of Classification Search
USPC ....................................................... 345/173
See application file for complete search history.

(56) References Cited

U.S. PATENT DOCUMENTS

| | | | | |
|---|---|---|---|---|
| 2011/0316809 | A1* | 12/2011 | Kim ...................... | G09G 3/3648 345/87 |
| 2012/0169629 | A1* | 7/2012 | Shih ...................... | G06F 3/0412 345/173 |
| 2013/0127790 | A1* | 5/2013 | Wassvik ................ | G06F 3/0428 345/175 |
| 2016/0363304 | A1* | 12/2016 | Omata ................. | F21V 23/0485 |
| 2017/0003782 | A1* | 1/2017 | Heo ....................... | G06F 3/0447 |
| 2017/0177141 | A1* | 6/2017 | Shih ....................... | G06F 3/0412 |
| 2018/0143729 | A1* | 5/2018 | Lee ...................... | H01L 51/5253 |
| 2018/0275757 | A1* | 9/2018 | Cruz-Hernandez ......................... | G06F 3/0412 |

(Continued)

FOREIGN PATENT DOCUMENTS

| | | |
|---|---|---|
| CN | 109782965 | 5/2019 |
| CN | 110085651 | 8/2019 |

(Continued)

*Primary Examiner* — Chineyere D Wills-Burns
(74) *Attorney, Agent, or Firm* — JCIPRNET

(57) ABSTRACT

A touch display device, including a substrate and multiple light-emitting units bonded to the substrate, is provided. Each of the multiple light-emitting units includes at least one light-emitting element. A first light-emitting unit of the multiple light-emitting units includes at least one sensing element. In the first light-emitting unit, the at least one sensing element is located between the at least one light-emitting element and the substrate. The orthographic projection of the at least one sensing element on the substrate overlaps the orthographic projection of the at least one light-emitting element on the substrate.

15 Claims, 12 Drawing Sheets

(56) References Cited

U.S. PATENT DOCUMENTS

| | | | |
|---|---|---|---|
| 2018/0315900 A1* | 11/2018 | Lu | H01L 31/035218 |
| 2018/0329555 A1* | 11/2018 | Kim | G09G 3/3208 |
| 2018/0364845 A1* | 12/2018 | Lee | G06F 3/0412 |
| 2019/0310731 A1* | 10/2019 | Rhe | G06F 3/0446 |
| 2020/0348772 A1* | 11/2020 | Chen | G06F 3/041 |
| 2021/0109618 A1* | 4/2021 | Huang | G06F 3/0412 |
| 2021/0124441 A1* | 4/2021 | Ding | G06F 3/042 |
| 2021/0296403 A1* | 9/2021 | Jin | G06F 3/0445 |

FOREIGN PATENT DOCUMENTS

| | | |
|---|---|---|
| CN | 110362221 | 10/2019 |
| TW | 201947290 | 12/2019 |

* cited by examiner

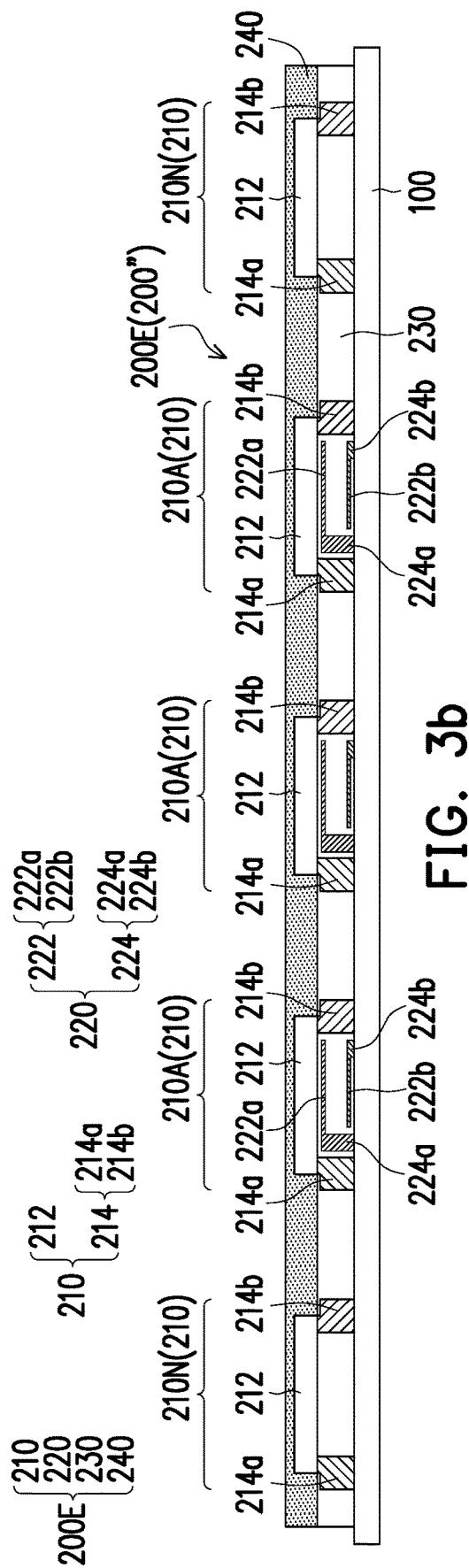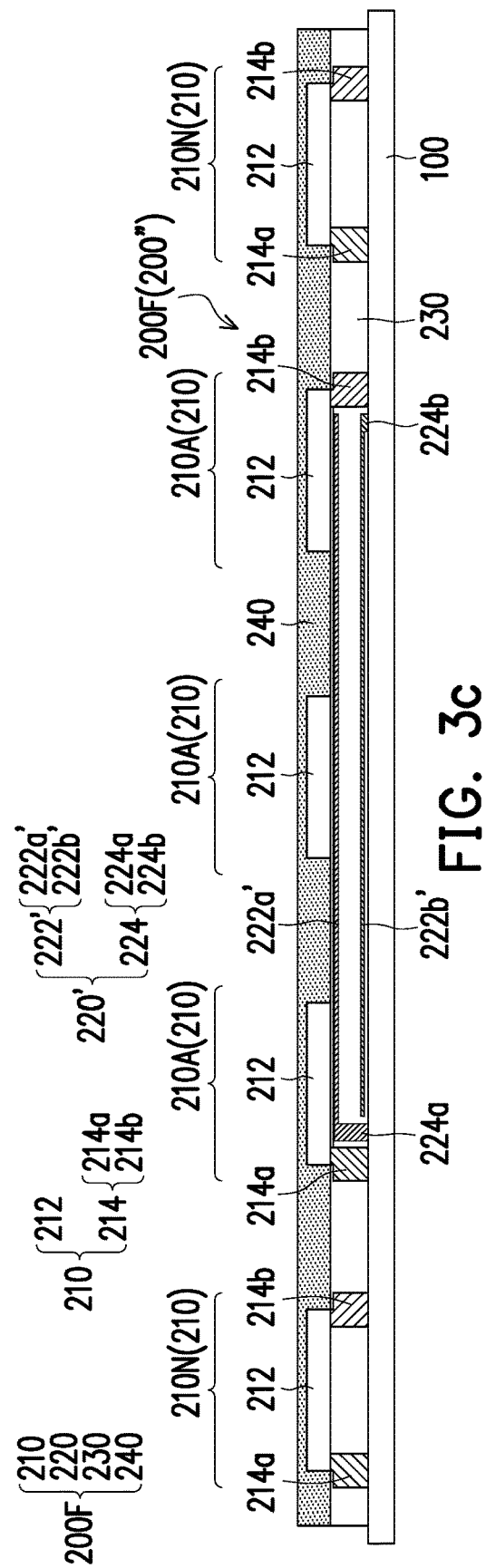
FIG. 3b
FIG. 3c

TOUCH DISPLAY DEVICE

CROSS-REFERENCE TO RELATED APPLICATION

This application claims the priority benefit of Taiwan application serial no. 109120526, filed on Jun. 18, 2020. The entirety of the abovementioned patent application is hereby incorporated by reference herein and made a part of this specification.

BACKGROUND

Technical Field

This disclosure relates to a display device, and in particular to a touch display device.

Description of Related Art

Touch display devices may be divided into a resistive, a capacitive or a wave touch display device according to their sensing manner. A capacitive touch element used in the capacitive touch display device has advantages such as fast response, good reliability, and high durability. Therefore, the capacitive touch display device is widely applied to electronic products.

In addition, the development of micro LED has been booming in recent years. For example, from white light-emitting backlight modules composed of blue LED chips with phosphors, RGB LED chip backlight modules have now been proposed. The RGB chip backlight module can greatly reduce a thickness of the display device. However, when taking into consideration a touch function, the thickness of the display device increases, as a result of the touch function only being able to be made on a cover lens.

SUMMARY

The disclosure provides a touch display device, which can reduce a thickness of the touch display device.

An embodiment of the disclosure provides a touch display device, which includes a substrate and multiple light-emitting units bonded to the substrate. Each of the multiple light-emitting units includes at least one light-emitting element. A first light-emitting unit of the multiple light-emitting units includes at least one sensing element. In the first light-emitting unit, the at least one sensing element is located between the at least one light-emitting element and the substrate. The orthographic projection of the at least one sensing element on the substrate overlaps the orthographic projection of the at least one light-emitting element on the substrate.

In an embodiment of the disclosure, each of the multiple light-emitting units is the first light-emitting unit.

In an embodiment of the disclosure, the first light-emitting unit includes multiple light-emitting elements, and the number of the at least one sensing element is one. Orthographic projections of the multiple light-emitting elements on the substrate overlap the orthographic projection of the sensing element on the substrate.

In an embodiment of the disclosure, a second light-emitting unit of the multiple light-emitting units does not include a sensing element.

In an embodiment of the disclosure, the first light-emitting unit is disposed at a central region of the substrate while the second light-emitting unit is disposed at a peripheral region of the substrate, and the peripheral region surrounds the central region.

In an embodiment of the disclosure, the first light-emitting unit includes the multiple light-emitting elements, and the orthographic projection of a first light-emitting element of the multiple light-emitting elements on the substrate overlaps the orthographic projection of the at least one sensing element on the substrate.

In an embodiment of the disclosure, the orthographic projection of a second light-emitting element of the multiple light-emitting elements on the substrate does not overlap the orthographic projection of the at least one sensing element on the substrate.

In an embodiment of the disclosure, the first light-emitting element is disposed at a central region of the first light-emitting unit, while the second light-emitting element is disposed at a peripheral region of the first light-emitting unit, and the peripheral region surrounds the central area.

In an embodiment of the disclosure, the numbers of the first light-emitting element and the second light-emitting element are respectively in plurality, and the multiple first light-emitting elements and the multiple second light-emitting elements are in a staggered disposition.

In an embodiment of the disclosure, each of the multiple light-emitting units further includes a carrier board. The carrier board is bonded to the substrate, and the at least one light-emitting element and the at least one sensing element are disposed in the corresponding carrier board.

In an embodiment of the disclosure, each of the at least one light-emitting element includes an LED (light-emitting diode) crystal grain and a light-emitting circuit. Each of the at least one sensing element includes a sensing electrode and a sensing circuit, and the light-emitting circuit and the sensing circuit are electrically separated.

In an embodiment of the disclosure, the light-emitting circuit includes a positive electrode circuit and a negative electrode circuit, and the positive electrode circuit and the negative electrode circuit are electrically separated.

In an embodiment of the disclosure, the sensing electrode includes a transport electrode (Tx) and a receiving electrode (Rx), and the transport electrode (Tx) and the receiving electrode (Rx) are electrically separated.

In an embodiment of the disclosure, the transport electrode (Tx) and the receiving electrode (Rx) are both disposed parallel to a surface of the substrate.

In an embodiment of the disclosure, the transport electrode (Tx) and the receiving electrode (Rx) are both disposed perpendicular to a surface of the substrate.

In an embodiment of the disclosure, the substrate further includes a light-emitting transmission circuit and a sensing transmission circuit. The light-emitting transmission circuit and the sensing transmission circuit are electrically separated. The light-emitting transmission circuit is connected to the light-emitting circuit and the sensing transmission circuit is connected to the sensing circuit.

In an embodiment of the disclosure, the LED crystal grain includes a micro LED crystal grain, a mini LED crystal grain, or a combination of the above.

The touch display device according to the embodiments of the disclosure can realize the thinning of the touch display device by integrating the sensing element into the light-emitting element. In addition, the sensing resolution may be determined by adjusting the spacings between the light-emitting units, and any faulty light-emitting unit may be replaced separately without the need to scrap the entire touch display device.

To make the above-mentioned features and advantages more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3b is a cross-sectional view of a light-emitting unit according to an embodiment of the disclosure.

FIG. 3c is a cross-sectional view of the light-emitting unit according to an embodiment of the disclosure.

DESCRIPTION OF THE EMBODIMENTS

Figure 1A:
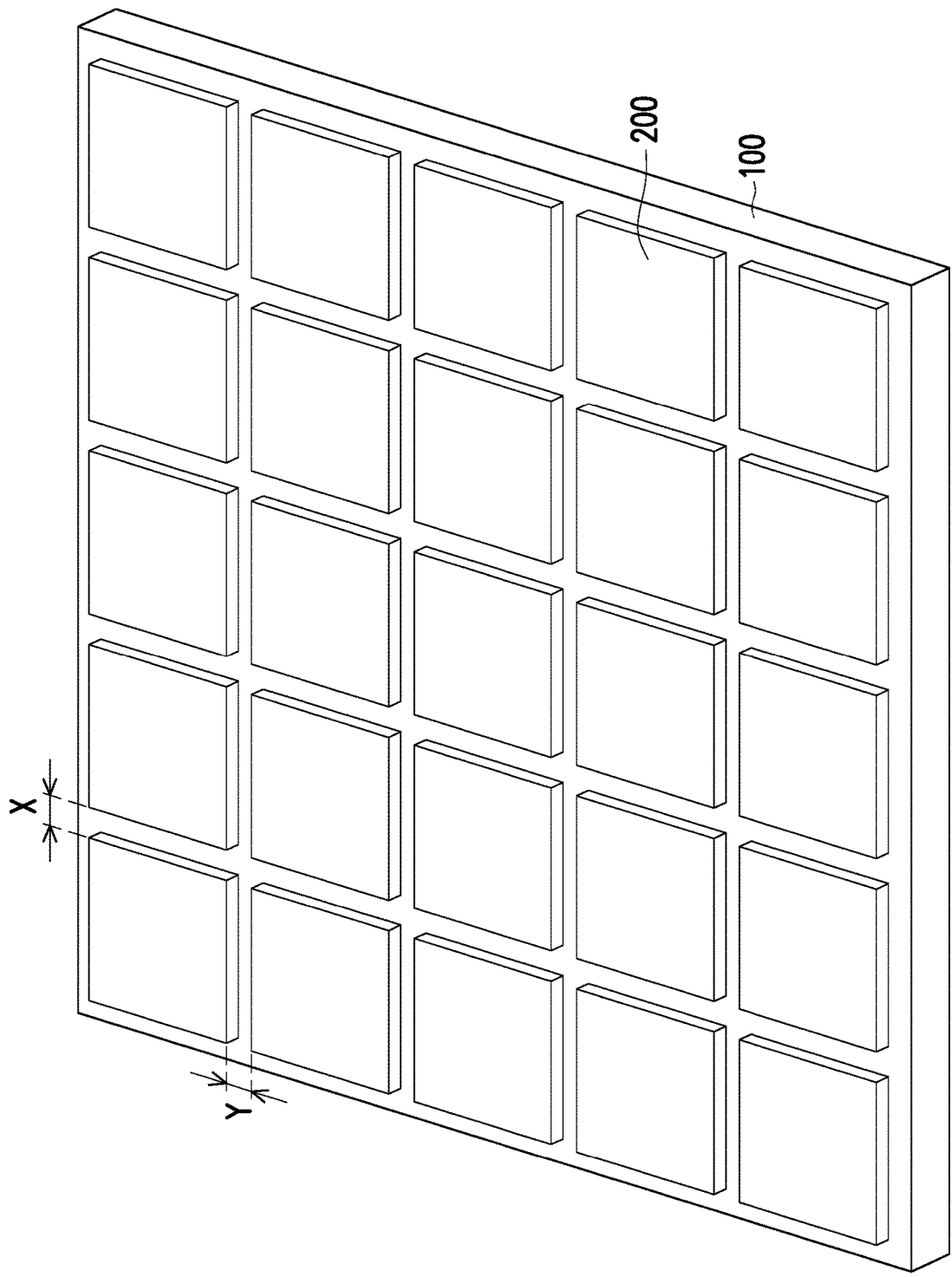
FIG. 1a is a perspective view of a touch display device according to an embodiment of the disclosure.

FIG. 1a is a perspective view of a touch display device 10 according to an embodiment of the disclosure. The touch display device 10 includes a substrate 100 and multiple light-emitting units 200. The light-emitting units 200 are bonded to the substrate 100, and each of the light-emitting units 200 includes a light-emitting element and a sensing element. In the embodiment, the sensing resolution may be determined by adjusting spacings X and Y between the light-emitting units 200, and any faulty light-emitting unit 200 may be replaced separately. Hereinafter, accompanied by FIGS. 1b and 1c, various possible structures of the light-emitting unit 200 of the embodiment are described, but the disclosure is not limited thereto.

Figure 1B:
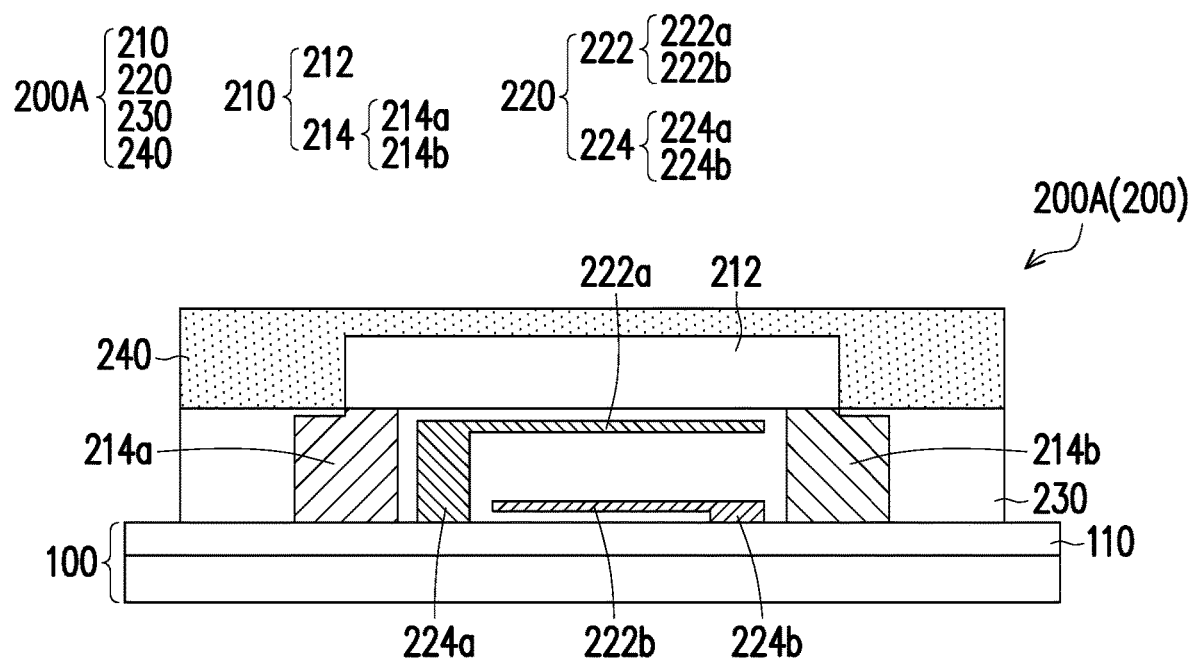
FIG. 1b is a cross-sectional view of a light-emitting unit according to an embodiment of the disclosure.

FIG. 1b is a cross-sectional view of the light-emitting unit 200 according to an embodiment of the disclosure. In the embodiment, a first light-emitting unit 200A may be regarded as an implementation of the light-emitting unit 200 in FIG. 1a, and the first light-emitting unit 200A includes a light-emitting element 210 and a sensing element 220. In the embodiment, the first light-emitting unit 200A may include a carrier board 230. The carrier board 230 is bonded to the substrate 100, and the light-emitting element 210 and the sensing element 220 are disposed on the carrier board 230. In addition, the first light-emitting unit 200A may further include a protective layer 240, and the protective layer 240 surrounds the light-emitting element 210 to prevent the light-emitting element 210 from being damaged. The material of the protective layer 240 is, for example, an insulating material.

With reference to FIG. 1b, the light-emitting element 210 may include a LED (light-emitting diode) crystal grain 212 and a light-emitting circuit 214 disposed in the carrier board 230. The LED crystal grain 212 is bonded onto the carrier board 230. For example, the LED crystal grain 212 may be a micro LED crystal grain, a mini LED crystal grain, or a combination of the above, but the disclosure is not limited thereto. The light-emitting circuit 214 generally includes a positive electrode circuit 214a and a negative electrode circuit 214b. The positive electrode circuit 214a and the negative electrode circuit 214b are respectively connected to two electrode ends of the LED crystal grain 212.

The sensing element 220 may include a sensing electrode 222 and a sensing circuit 224, and the sensing electrode 222 and the sensing circuit 224 may be disposed in the carrier board 230. The sensing electrode 222 may include a transport electrode (Tx) 222a and a receiving electrode (Rx) 222b, so as to form, for example, a capacitive touch sensing element. The sensing circuit 224 may include a transport circuit 224a and a receiving circuit 224b respectively connected to the transport electrode (Tx) 222a and the receiving electrode (Rx) 222b. In the embodiment, both the transport electrode (Tx) 222a and the receiving electrode (Rx) 222b of the sensing electrode 222 are disposed parallel to a surface of the substrate 100. However, the configuration of the sensing electrode of the disclosure is not limited thereto. By integrating the sensing element 220 on the carrier board 230 of the first light-emitting unit 200A, the sensing element 220 is located between the light-emitting element 210 and the substrate 100. As a result, the orthographic projection of the sensing element 220 on the substrate 100 overlaps the orthographic projection of the LED crystal grain 212 of the light-emitting element 210 on the substrate 100, so that a thickness of the light-emitting unit having a sensing function does not increase, therefore realizing the thinning of the touch display device.

In an embodiment of the disclosure, with reference to FIG. 1b, the substrate 100 may further include a transmission circuit layer 110. Although not shown in the figure, the transmission circuit layer 110 may be composed of multiple conductive layers and insulation layers that separate the multiple conductive layers. The multiple conductive layers in the transmission circuit layer 110 may form a light-emitting transmission circuit and a sensing transmission circuit. The light-emitting transmission circuit and the sensing transmission circuit are electrically separated. The light-emitting transmission circuit is connected to the light-emitting circuit 214 of the light-emitting element 210, while the sensing transmission circuit is connected to the sensing circuit 224 of the sensing element 220.

Figure 1C:
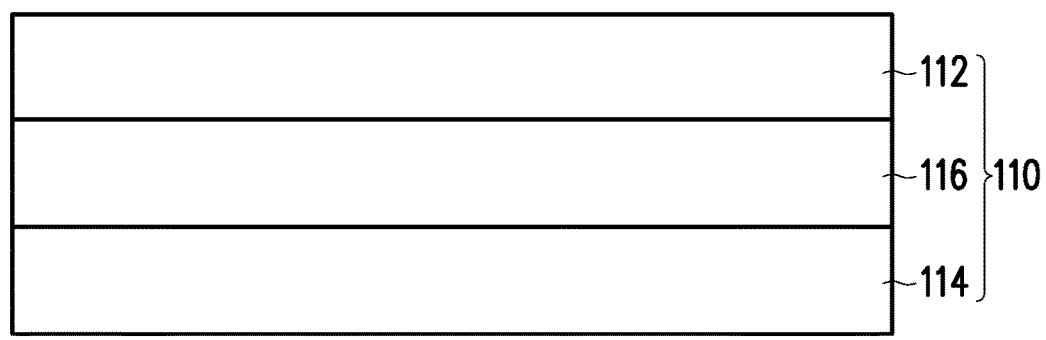
FIG. 1c is a cross-sectional schematic view of a transmission circuit layer according to an embodiment of the disclosure.

For example, with reference to FIG. 1c, the transmission circuit layer 110 may include a first conductive layer 112, a second conductive layer 114, and an insulation layer 116.

The light-emitting transmission circuit may be formed in the first conductive layer 112, the sensing transmission circuit may be formed in the second conductive layer 114, and the insulation layer 116 is located between the first conductive layer 112 and the second conductive layer 114, so that the light-emitting transmission circuit and the sensing transmission circuit are electrically separated. However, relative positions of the first conductive layer 112, the second conductive layer 114 and the insulation layer 116 are not limited to those shown in FIG. 1c. For example, in another embodiment, the positions of the first conductive layer 112 and the second conductive layer 114 may interchange, so that the first conductive layer 112 is located below the insulation layer 116 and the second conductive layer 114 is located above the insulation layer 116. In other embodiments, the light-emitting transmission circuit may be partially formed at the first conductive layer 112 and partially formed at the second conductive layer 114, and the sensing transmission circuit may be partially formed at the first conductive layer 112 and partially formed at the second conductive layer 114.

Figure 1D:
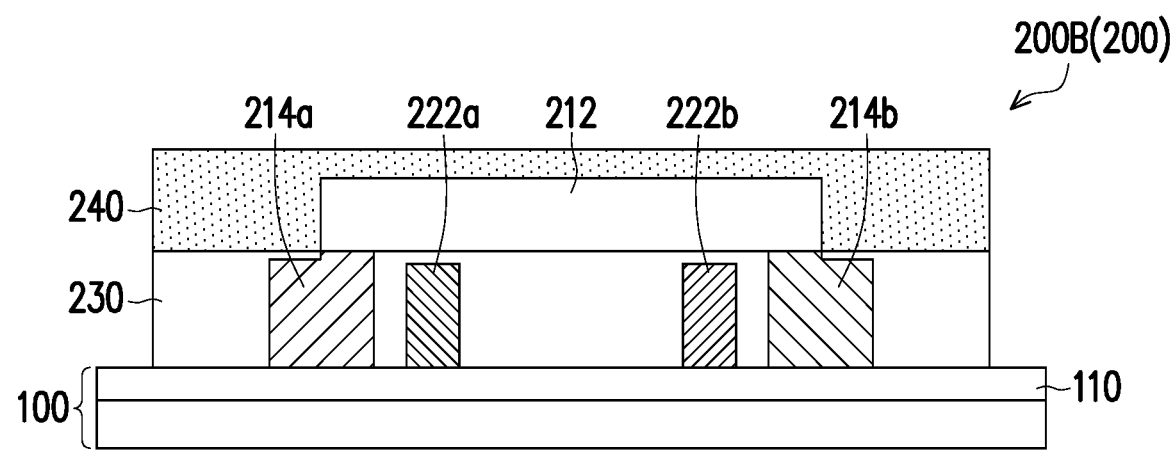
FIG. 1d is a cross-sectional view of the light-emitting unit according to an embodiment of the disclosure.

With reference to FIG. 1d, FIG. 1d is a cross-sectional view of the light-emitting unit 200 according to an embodiment of the disclosure. In the embodiment, a first light-emitting unit 200B may be regarded as an implementation of the light-emitting unit 200 in FIG. 1a. The design of the first light-emitting unit 200B is substantially the same as that of the first light-emitting unit 200A except that in the first light-emitting unit 200B, both the transport electrode (Tx) 222a and the receiving electrode (Rx) 222b are disposed perpendicular to the surface of the substrate 100. As described above, by integrating the sensing element 220 on the carrier board 230 of the first light-emitting unit 200B, the sensing element 220 is located between the light-emitting element 210 and the substrate 100. The orthographic projection of the sensing element 220 on the substrate 100 overlaps the orthographic projection of the light-emitting element 210 on the substrate 100, so that the thickness of the light-emitting unit having the sensing function does not increase, therefore realizing the thinning of the touch display device.

Figure 2A:
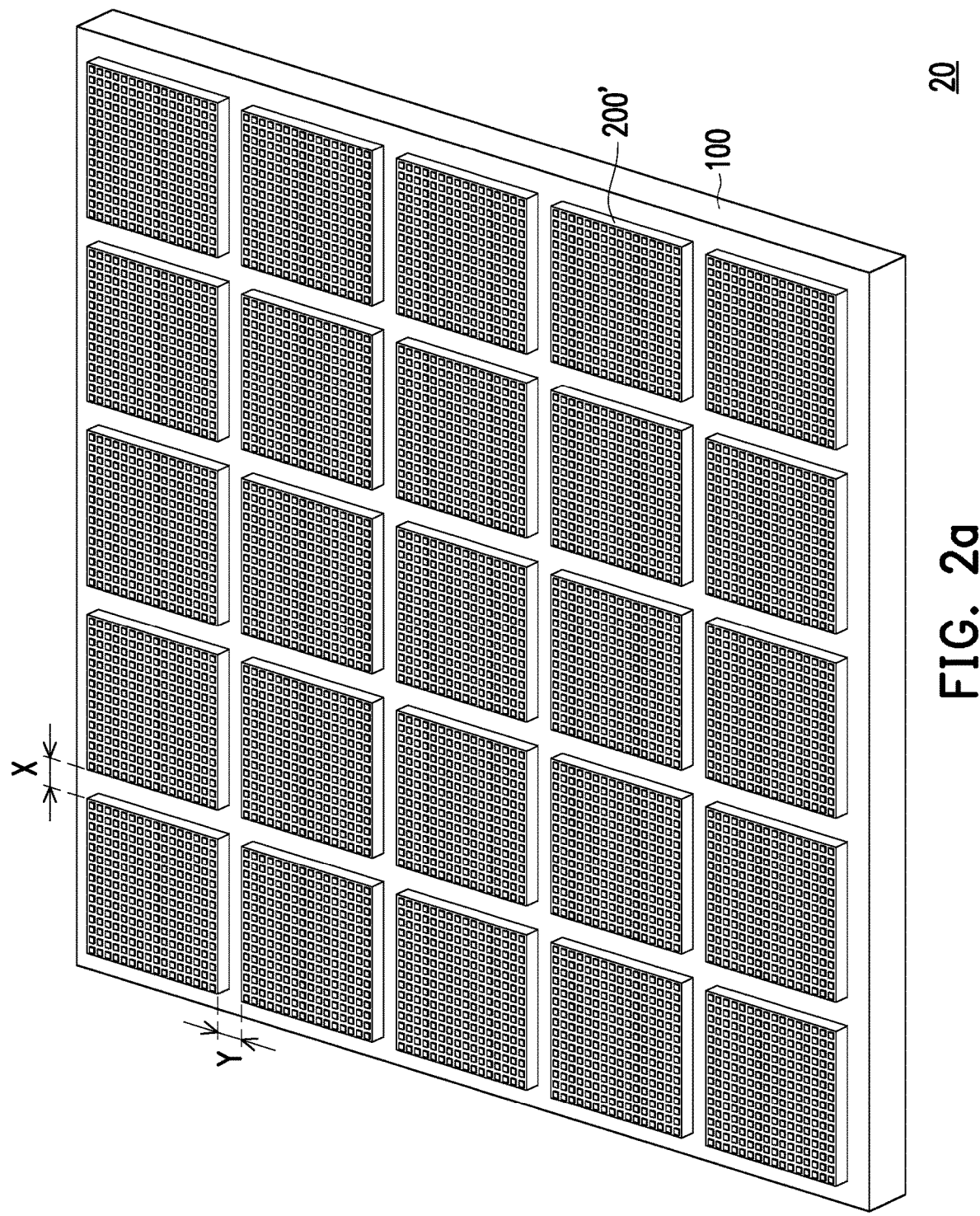
FIG. 2a is a perspective view of a touch display device according to an embodiment of the disclosure.

FIG. 2a is a perspective view of a touch display device 20 according to an embodiment of the disclosure. The touch display device 20 includes the substrate 100 and multiple light-emitting units 200'. The light-emitting units 200' are bonded to the substrate 100, and each of the light-emitting units 200' includes multiple light-emitting elements and at least one sensing element. In the embodiment, the sensing resolution may be determined by adjusting the spacings X and Y between the light-emitting units 200', and any faulty light-emitting unit 200' may be replaced separately. Hereinafter, accompanied by FIGS. 2b and 2c, various possible structures of the light-emitting unit 200' of the embodiment are described, but the disclosure is not limited thereto.

Figure 2B:
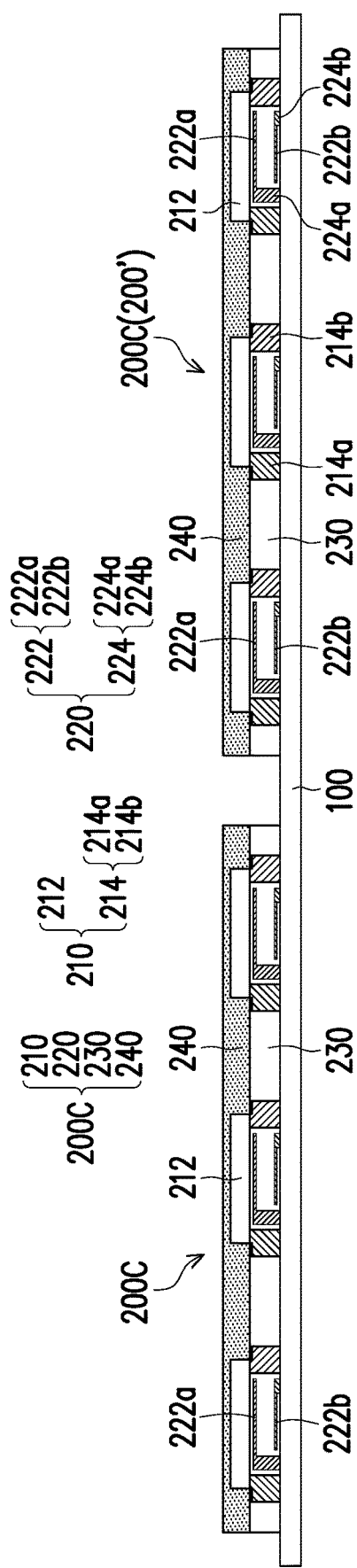
FIG. 2b is a cross-sectional view of the light-emitting unit according to an embodiment of the disclosure.

FIG. 2b is a cross-sectional view of the light-emitting unit 200' according to an embodiment of the disclosure. In the embodiment, a first light-emitting unit 200C may be regarded as an implementation of the light-emitting unit 200' in FIG. 2a, and the first light-emitting unit 200C includes multiple light-emitting elements 210 and multiple sensing elements 220. In the embodiment, the first light-emitting unit 200C may further include the carrier board 230. The carrier board 230 is bonded to the substrate 100, and the multiple light-emitting elements 210 and the multiple sensing elements 220 are disposed on the carrier board 230. In addition, the first light-emitting unit 200C may further include the protective layer 240, and the protective layer 240 surrounds the light-emitting elements 210 to prevent the light-emitting elements 210 from being damaged.

With reference to FIG. 2b, the multiple light-emitting elements 210 share the same carrier board 230, and each of the light-emitting elements 210 may include the LED crystal grain 212 and the light-emitting circuit 214 disposed in the carrier board 230. The light-emitting circuit 214 includes the positive electrode circuit 214a and the negative electrode circuit 214b. The positive electrode circuit 214a and the negative electrode circuit 214b are respectively connected to the two electrode ends of the LED crystal grain 212. In addition, the multiple sensing elements 220 are collectively disposed in the same carrier board 230, and each of the sensing elements 220 may include the sensing electrode 222 and the sensing circuit 224. The sensing electrode 222 may include the transport electrode (Tx) 222a and the receiving electrode (Rx) 222b, so as to form, for example, the capacitive touch sensing element. The sensing circuit 224 may include the transport circuit 224a and the receiving circuit 224b respectively connected to the transport electrode (Tx) 222a and the receiving electrode (Rx) 222b.

The orthographic projections of the transport electrode (Tx) 222a and the receiving electrode (Rx) 222b on the substrate 100 may overlap the orthographic projection of the single LED crystal grain 212 on the substrate 100. In other words, in the embodiment, each of the light-emitting elements 210 is disposed corresponding to a sensing element 220, so that each of the sensing elements 220 is located between the corresponding light-emitting element 210 and the substrate 100. The orthographic projection of the LED crystal grain 212 of each of the light-emitting elements 210 on the substrate 100 overlaps the orthographic projection of one of the sensing elements 220 on the substrate 100. In this way, the distribution density of the sensing element 220 may correspond to the distribution density of the light-emitting element 210, so that the touch display device 20 can provide a high-resolution sensing function. In addition, as in the foregoing embodiment, the sensing element 220 is located between the light-emitting element 210 and the substrate 100. The orthographic projection of the sensing element 220 on the substrate 100 overlaps the orthographic projection of the LED crystal grain 212 of the light-emitting element 210 on the substrate 100, so that the thickness of the light-emitting unit having the sensing function does not increase, therefore realizing the thinning of the touch display device.

Figure 2C:
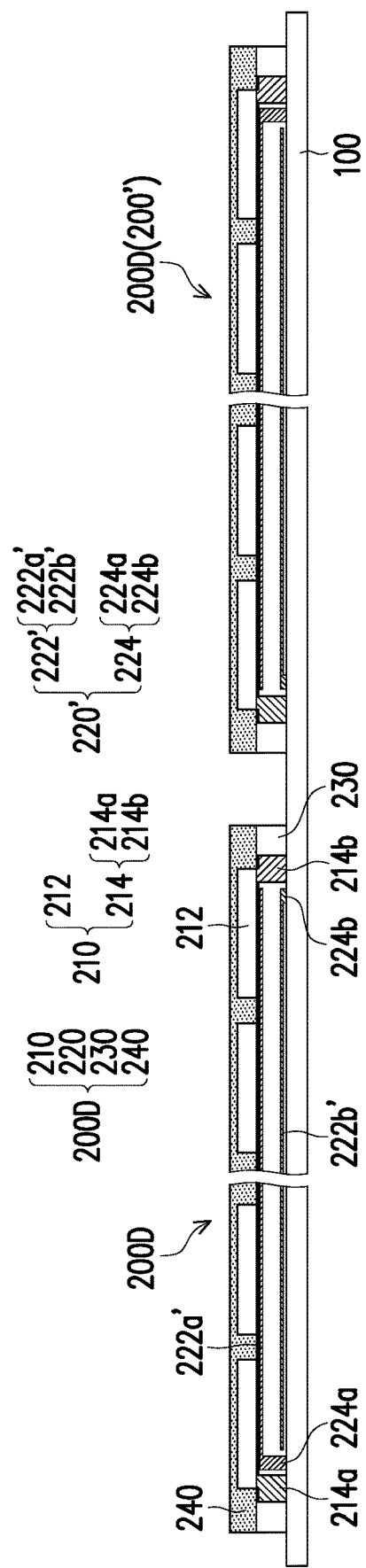
FIG. 2c is a cross-sectional view of the light-emitting unit according to an embodiment of the disclosure.

FIG. 2c is a cross-sectional view of the light-emitting unit 200' according to an embodiment of the disclosure. In the embodiment, a first light-emitting unit 200D may be regarded as an implementation of the light-emitting unit 200' in FIG. 2a, and the first light-emitting unit 200D includes the multiple light-emitting elements 210 and a sensing element 220'. In the embodiment, the first light-emitting unit 200D may further include the carrier board 230. The carrier board 230 is bonded to the substrate 100, and the multiple light-emitting elements 210 and the sensing element 220' are disposed on the carrier board 230. In addition, the first light-emitting unit 200D may further include the protective layer 240, and the protective layer 240 surrounds the light-emitting elements 210 to prevent the light-emitting elements 210 from being damaged.

With reference to FIG. 2c, the multiple light-emitting elements 210 share the same carrier board 230, and each of the light-emitting elements 210 may include the LED crystal grains 212 and the light-emitting circuit 214 disposed in the carrier board 230, so as to receive individual control signals. The light-emitting circuit 214 may include the positive electrode circuit 214a and the negative electrode circuit 214b. The positive electrode circuit 214a and the negative electrode circuit 214b are respectively connected to the two electrode ends of the LED crystal grain 212. In addition, the sensing element 220' may include a sensing electrode 222' and the sensing circuit 224. The sensing electrode 222' may include a transport electrode (Tx) 222a' and a receiving electrode (Rx) 222b', so as to form, for example, the capacitive touch sensing element. The sensing circuit 224 may include the transport circuit 224a and the receiving circuit 224b respectively connected to the transport electrode (Tx) 222a' and the receiving electrode (Rx) 222b'.

In the embodiment, the orthographic projections of the transport electrode (Tx) 222a' and the receiving electrode (Rx) 222b' on the substrate 100 may overlap the orthographic projections of several LED crystal grains 212 on the substrate 100. In other words, the multiple light-emitting elements 210 may collectively disposed corresponding to a sensing element 220', so that the sensing element 220' is located between the multiple light-emitting elements 210 and the substrate 100. The orthographic projection of the sensing element 220' on the substrate 100 overlaps the orthographic projections of the multiple light-emitting elements 210 on the substrate 100. In this way, the resolution of the light-emitting elements 210 and the resolution of the sensing element 220' may be different. In other words, N light-emitting elements may be disposed corresponding to M sensing elements to form the first light-emitting unit 200D, and N may be greater than M. M may be adjusted as per requirement to reduce the distribution density of the sensing element 220' without affecting the sensing resolution, thereby simplifying the circuit layout. In addition, as in the foregoing embodiments, the sensing element 220' is located between the multiple light-emitting elements 210 and the substrate 100. The orthographic projection of the sensing element 220' on the substrate 100 overlaps the orthographic projection of the LED crystal grains 212 of the multiple light-emitting elements 210 on the substrate 100, so that the thickness of the light-emitting unit having the sensing function does not increase, therefore realizing the thinning of the touch display device.

Figure 3A:
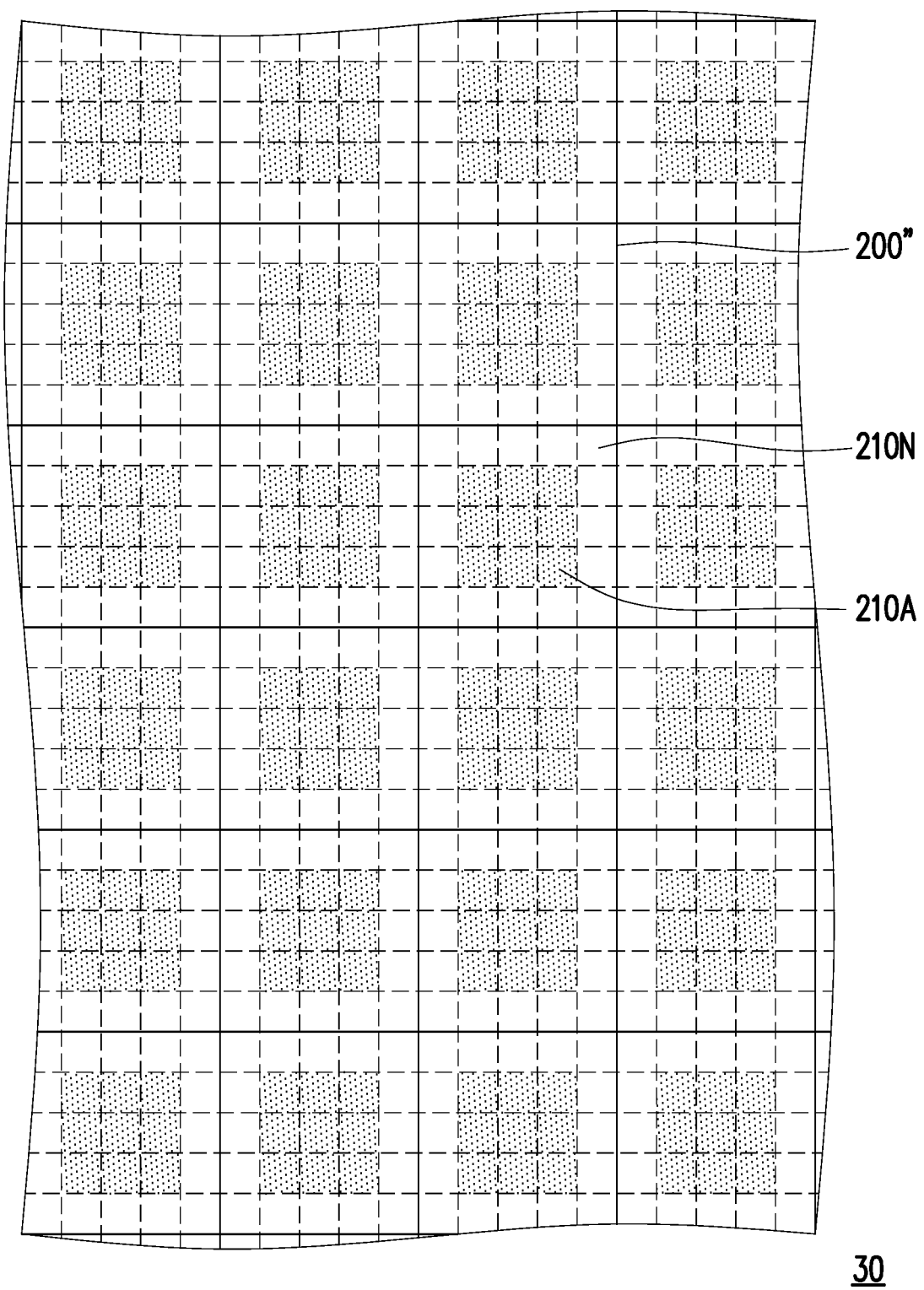
FIG. 3a is a partial top view of a touch display device according to an embodiment of the disclosure.

FIG. 3a is a partial top view of a touch display device 30 according to an embodiment of the disclosure. In the embodiment, the touch display device 30 includes a substrate and multiple light-emitting units 200". The light-emitting units 200" are bonded to the substrate, and each of the light-emitting units 200" includes the multiple light-emitting elements and the at least one sensing element. In the embodiment, the sensing resolution may be determined by adjusting the spacings between the light-emitting units 200", and any faulty light-emitting unit 200" may be replaced separately. Hereinafter, accompanied by FIGS. 3b and 3c, various possible structures of the light-emitting unit 200" of the embodiment are described, but the disclosure is not limited thereto. In the embodiment, the light-emitting unit 200" may include two types of light-emitting elements, such as a first light-emitting element 210A and a second light-emitting element 210N, and the at least one sensing element is for example, integrated with the first light-emitting element 210A.

FIG. 3b is a cross-sectional view of the light-emitting unit 200" according to an embodiment of the disclosure. In the embodiment, a first light-emitting unit 200E may be regarded as an implementation of the light-emitting unit 200" in FIG. 3a, and the first light-emitting unit 200E includes the multiple light-emitting elements 210 and the multiple sensing elements 220. In the embodiment, the first light-emitting unit 200E may further include the carrier board 230. The carrier board 230 is bonded to the substrate 100, and the multiple light-emitting elements 210 and the multiple sensing elements 220 are disposed on the carrier board 230. In addition, the first light-emitting unit 200E may further include the protective layer 240, and the protective layer 240 surrounds the light-emitting elements 210 to prevent the light-emitting elements 210 from being damaged.

With reference to FIG. 3b, the multiple light-emitting elements 210 share the same carrier board 230, and each of the light-emitting elements 210 may include the LED crystal grain 212 and the light-emitting circuit 214 disposed in the carrier board 230. The light-emitting circuit 214 includes the positive electrode circuit 214a and the negative electrode circuit 214b. The positive electrode circuit 214a and the negative electrode circuit 214b are respectively connected to the two electrode ends of the LED crystal grain 212. In addition, the multiple sensing elements 220 are collectively disposed in the same carrier board 230 and each of the sensing elements 220 may include the sensing electrode 222 and the sensing circuit 224. The sensing electrode 222 may include the transport electrode (Tx) 222a and the receiving electrode (Rx) 222b, so as to form, for example, the capacitive touch sensing element. The sensing circuit 224 may include the transport circuit 224a and the receiving circuit 224b respectively connected to the transport electrode (Tx) 222a and the receiving electrode (Rx) 222b.

In the embodiment, the multiple light-emitting elements 210 may include different types of light-emitting elements. For example, in the embodiment, the multiple light-emitting elements 210 of the first light-emitting unit 200E may include multiple first light-emitting elements 210A and multiple second light-emitting elements 210N. Each of the first light-emitting elements 210A is disposed corresponding to a sensing element 220, so that each of the sensing elements 220 is located between the corresponding first light-emitting element 210A and the substrate 100. The orthographic projection of the LED crystal grain 212 of each of the first light-emitting elements 210A on the substrate 100 overlaps the orthographic projection of the sensing element 220 on the substrate 100, while the orthographic projection of the second light-emitting element 210N on the substrate 100 does not overlap the orthographic projection of the sensing element 220 on the substrate 100. In addition, as in the foregoing embodiments, the sensing element 220 is located between the first light-emitting element 210A and the substrate 100. The orthographic projection of the sensing element 220 on the substrate 100 overlaps the orthographic projection of the first light-emitting element 210A on the substrate 100, so that the thickness of the light-emitting unit having the sensing function does not increase, therefore realizing the thinning of the touch display device.

With reference to FIGS. 3a and 3b concurrently, in the embodiment, the multiple first light-emitting elements 210A are disposed in a central region of the first light-emitting unit 200E, and the multiple second light-emitting elements 210N are disposed in a peripheral region of the first light-emitting unit 200E, and the peripheral region surrounds the central region. However, the disclosure does not limit the number and arrangement of the first light-emitting element 210A and the second light-emitting element 210N.

FIG. 3c is a cross-sectional view of the light-emitting unit 200" according to an embodiment of the disclosure. In the embodiment, a first light-emitting unit 200F may be regarded as an implementation of the light-emitting unit 200" in FIG. 3a, and the first light-emitting unit 200F includes the multiple light-emitting elements 210 and the sensing element 220'. In the embodiment, the first light-emitting unit 200F may further include the carrier board 230. The carrier board 230 is bonded to the substrate 100, and the multiple light-emitting elements 210 and the corresponding sensing element 220' are collectively disposed on the carrier board 230. In addition, the first light-emitting unit 200F may further include the protective layer 240, and the protective layer 240 surrounds the light-emitting elements 210 to prevent the light-emitting elements 210 from being damaged.

With reference to FIG. 3c, the multiple light-emitting elements 210 share the same carrier board 230, and each of the light-emitting elements 210 may include the LED crystal grain 212 and the light-emitting circuit 214 disposed in the carrier board 230, so as to receive the individual control signals. The light-emitting circuit 214 includes the positive electrode circuit 214a and the negative electrode circuit 214b. The positive electrode circuit 214a and the negative electrode circuit 214b are respectively connected to the two electrode ends of the LED crystal grain 212. In addition, the sensing element 220' may include the sensing electrode 222' and the sensing circuit 224. The sensing electrode 222' may include the transport electrode (Tx) 222a' and the receiving electrode (Rx) 222b' so as to form, for example, the capacitive touch sensing element. The sensing circuit 224 may include the transport circuit 224a and the receiving circuit 224b respectively connected to the transport electrode (Tx) 222a' and the receiving electrode (Rx) 222b'.

In the embodiment, the multiple light-emitting elements 210 of the first light-emitting unit 200F include the multiple first light-emitting elements 210A and the multiple second light-emitting elements 210N. The multiple first light-emitting elements 210A may be disposed corresponding to a sensing element 220', so that the sensing element 220' is located between the multiple first light-emitting elements 210A and the substrate 100. The orthographic projections of the transport electrode (Tx) 222a' and the receiving electrode (Rx) 222b' of the sensing element 220' on the substrate 100 overlap the orthographic projection of the multiple first light-emitting elements 210A on the substrate 100, while the orthographic projection of the second light-emitting element 210N on the substrate 100 does not overlap the orthographic projection of the sensing element 220' on the substrate 100. In this way, the resolution of the light-emitting elements 210 and the resolution of the sensing element 220' may be different. The resolution of the sensing element 220' may be adjusted as per requirement to reduce the distribution density of the sensing element 220' without affecting the sensing resolution, thereby simplifying the circuit layout. In addition, as in the foregoing embodiments, the sensing element 220' is located between the first light-emitting elements 210A and the substrate 100. The orthographic projection of the sensing element 220' on the substrate 100 overlaps the orthographic projections of the multiple first light-emitting elements 210A on the substrate 100, so that the thickness of the light-emitting unit having the sensing function does not increase, therefore realizing the thinning of the touch display device.

In addition, the number and arrangement of the first light-emitting elements 210A and the second light-emitting elements 210N shown in FIGS. 3a to 3c are for illustration only, and the disclosure does not limit the number and arrangement of the first light-emitting elements 210A and the second light-emitting elements 210N. The number and arrangement of the first light-emitting element 210A and the second light-emitting element 210N may be appropriately changed according to actual requirements, so as to provide a touch display device with a simple manufacturing process and reduced manufacturing cost without affecting the sensing resolution. In addition, in the foregoing embodiments, the size and spacing of the first light-emitting element 210A and the second light-emitting element 210N may be the same or different, so as to provide different displays and sensing resolutions to meet design requirements of different display regions.

Figure 4A:
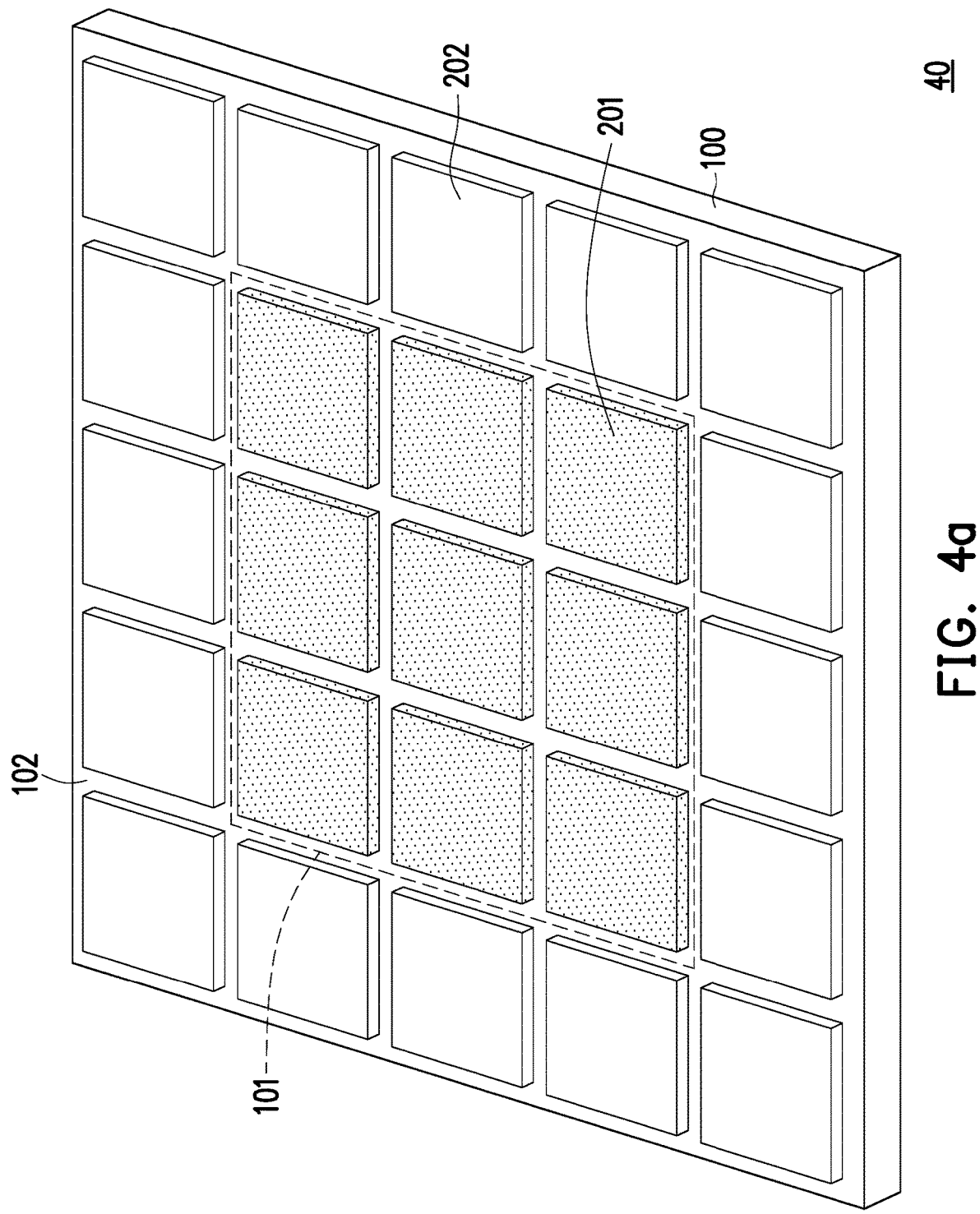
FIG. 4a is a perspective view of a touch display device according to an embodiment of the disclosure.

FIG. 4a is a perspective view of a touch display device 40 according to an embodiment of the disclosure. The touch display device 40 includes the substrate 100 and multiple first light-emitting units 201 and multiple second light-emitting units 202. The first light-emitting units 201 and the second light-emitting units 202 are bonded to the substrate 100. In the embodiment, the first light-emitting unit 201 includes a light-emitting element and a sensing element, and may be the above first light-emitting units 200A, 200B, 200C, 200D, 200E, or 200F. The second light-emitting unit 202 does not include a sensing element, so that the touch display device 40 may determine the distribution of the sensing element by arranging the first light-emitting units 201 and the second light-emitting units 202. Hereinafter, accompanied by FIGS. 4b and 4c, various possible structures of the second light-emitting unit 202 of the embodiment are described, but the disclosure is not limited thereto.

Figure 4B:
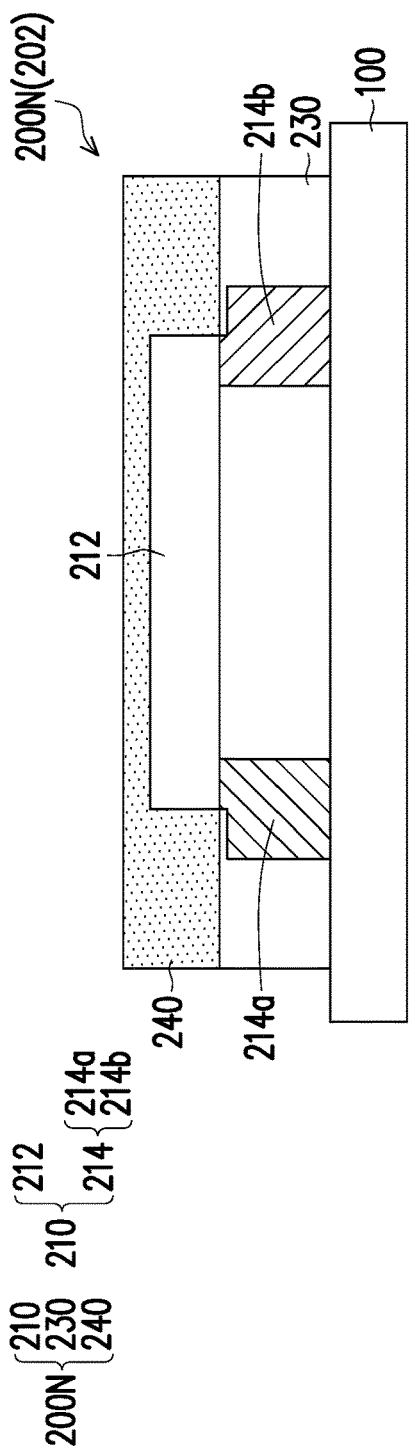
FIG. 4b is a cross-sectional view of a light-emitting unit according to an embodiment of the disclosure.

FIG. 4b is a cross-sectional view of the second light-emitting unit 202 according to an embodiment of the disclosure. In the embodiment, a second light-emitting unit 200N may be regarded as an implementation of the second light-emitting unit 202 in FIG. 4a, and the second light-emitting unit 200N includes the light-emitting element 210, but does not include a sensing element. In the embodiment, the second light-emitting unit 200N may include the carrier board 230. The carrier board 230 is bonded to the substrate 100, and the light-emitting element 210 is disposed on the carrier board 230. In addition, the second light-emitting unit 200N may further include the protective layer 240, and the protective layer 240 surrounds the light-emitting element 210 to prevent the light-emitting element 210 from being damaged.

With reference to FIG. 4b, the light-emitting element 210 may include the LED crystal grain 212 and the light-emitting circuit 214 disposed in the carrier board 230, and the LED crystal grain 212 is bonded onto the carrier board 230. For example, the LED crystal grain 212 may be a micro LED crystal grain, a mini LED crystal grain, or a combination of the above, but the disclosure is not limited thereto. The light-emitting circuit 214 includes the positive electrode circuit 214a and the negative electrode circuit 214b. The positive electrode circuit 214a and the negative electrode circuit 214b are respectively connected to the two electrode ends of the LED crystal grain 212.

Figure 4C:
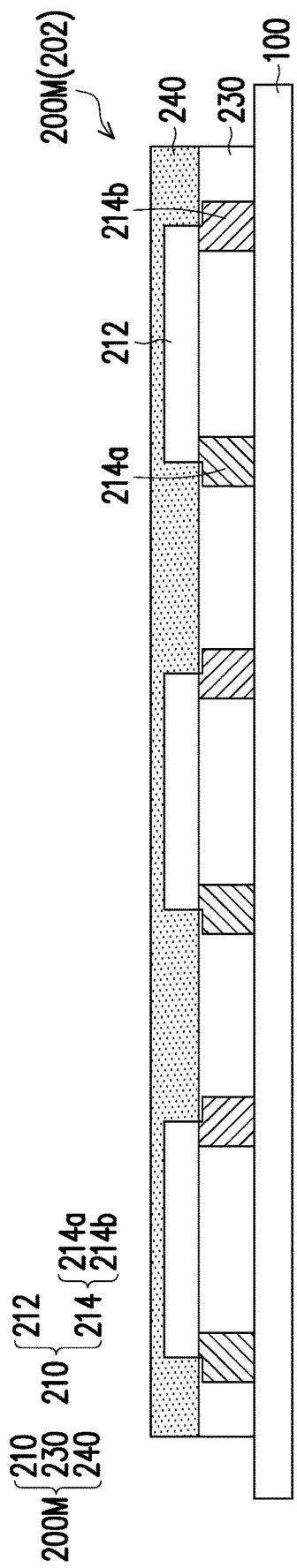
FIG. 4c is a cross-sectional view of the light-emitting unit according to an embodiment of the disclosure.

FIG. 4c is a cross-sectional view of the second light-emitting unit 202 according to an embodiment of the disclosure. In the embodiment, a second light-emitting unit 200M may be regarded as an implementation of the second light-emitting unit 202 in FIG. 4a. The second light-emitting unit 200M includes the multiple light-emitting elements 210, but does not include a sensing element. In the embodiment, the second light-emitting unit 200M may further include the carrier board 230. The carrier board 230 is bonded to the substrate 100, and the multiple light-emitting elements 210 are disposed on the carrier board 230. In addition, the second light-emitting unit 200M may further include the protective layer 240, and the protective layer 240 surrounds the light-emitting elements 210 to prevent the light-emitting elements 210 from being damaged.

With reference to FIG. 4c, the multiple light-emitting elements 210 share the same carrier board 230, and each of the light-emitting elements 210 may include the LED crystal grain 212 and the light-emitting circuit 214 disposed in the carrier board 230. The light-emitting circuit 214 includes the positive electrode circuit 214a and the negative electrode circuit 214b. The positive electrode circuit 214a and the negative electrode circuit 214b are respectively connected to the two electrode ends of the LED crystal grain 212.

In the touch display device 40 of FIG. 4a, the first light-emitting unit 201 is disposed in a central region 101 of the substrate 100, while the second light-emitting unit 202 is disposed in a peripheral region 102 of the substrate 100, and the peripheral region 102 surrounds the central region. 101. In some embodiments, the sensing resolution required by the peripheral region 102 of the touch display device 40 is lower than that of the central region 101. Therefore, the second light-emitting unit 202 without a sensing element may be disposed at the peripheral region 102 of the touch display device 40, so that the number of sensing element used may be reduced, thereby reducing the number of transmission lines required by the sensing elements and facilitating the simplification of the circuit layout design.

Figure 4D:
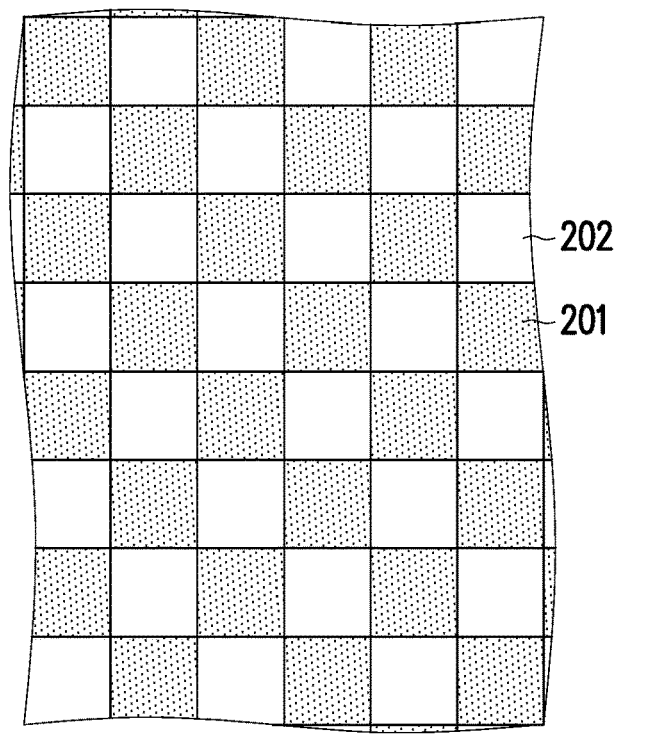
FIG. 4d is a partial top view of a touch display device according to an embodiment of the disclosure.

FIG. 4d is a partial top view of a touch display device 40' according to an embodiment of the disclosure. In the embodiment, the touch display device 40' includes the multiple first light-emitting units 201 and the multiple second light-emitting units 202 in a staggered disposition. The first light-emitting unit 201 may be the above first light-emitting units 200A, 200B, 200C, 200D, 200E, or 200F, and the second light-emitting unit 202 may be the above second light-emitting units 200N or 200M. Specifically, the first light-emitting units 201 and the second light-emitting units 202 of the embodiment are arranged in an array, and in the row direction and the column direction, each of the first light-emitting units 201 is sandwiched between two of the second light-emitting units 202, and each of the second light-emitting units 202 is sandwiched between two of the first light-emitting units 201. In other words, in the row direction and the column direction, one of two adjacent light-emitting units is the first light-emitting unit 201 while the other is the second light-emitting unit 202, but the disclosure is not limited thereto. As in the foregoing embodiments, the sensing element 220 in the first light-emitting units 200A, 200B, 200C, 200D, 200E, or 200F is located between the light-emitting element 210 and the substrate 100. The orthographic projection of the sensing element 220 on the substrate 100 overlaps the orthographic projection of the LED crystal grain 212 of the multiple first light-emitting element 210A on the substrate 100, so that the thickness of the light-emitting unit having the sensing function does not increase, therefore realizing the thinning of the touch display device.

Figure 4E:
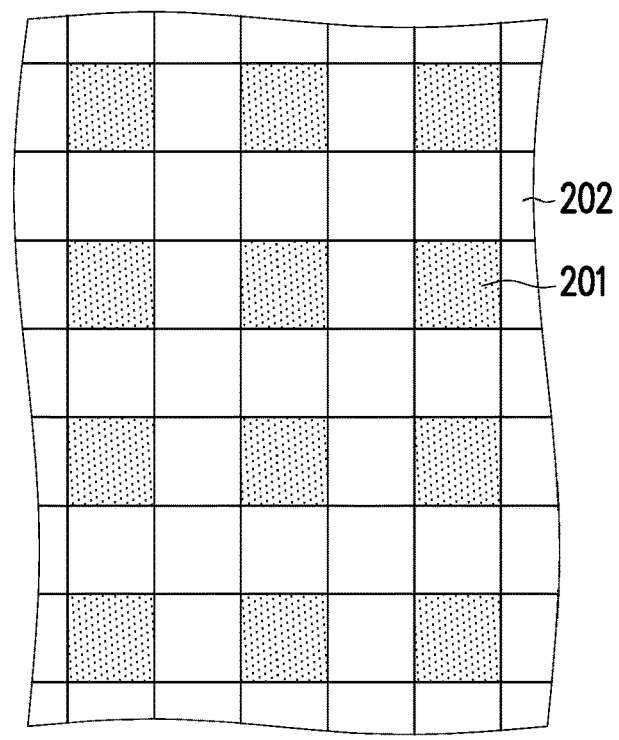
FIG. 4e is a partial top view of a touch display device according to an embodiment of the disclosure.

FIG. 4e is a partial top view of a touch display device 40" according to an embodiment of the disclosure. In the embodiment, the touch display device 40" includes the multiple first light-emitting units 201 and the multiple second light-emitting units 202, and each of the first light-emitting unit 201 is surrounded by the second light-emitting unit 202. The first light-emitting unit 201 may be the above first light-emitting units 200A, 200B, 200C, 200D, 200E, or 200F, and the second light-emitting unit 202 may be the above second light-emitting units 200N or 200M. Specifically, the first light-emitting units 201 and the second light-emitting units 202 of the embodiment are arranged in an array. On odd-numbered rows, the first light-emitting units 201 and the second light-emitting units 202 are alternately disposed, while on even-numbered rows, only the second light-emitting units 202 are disposed, without any of the first light-emitting unit 201. In this way, regardless in the row direction, the column direction or the oblique direction, there is at least one second light-emitting unit 202 between any two of the first light-emitting units 201, but the disclosure is not limited thereto. As in the foregoing embodiments, the sensing element 220 in the first light-emitting unit 200A, 200B, 200C, 200D, 200E, or 200F is located between the light-emitting element 210 and the substrate 100. The orthographic projection of the sensing element 220 on the substrate 100 overlaps the orthographic projection of the LED crystal grain 212 of the multiple first light-emitting element 210 on the substrate 100, so that the thickness of the light-emitting unit having the sensing function does not increase, therefore realizing the thinning of the touch display device.

The above examples are only for illustrating the number and arrangement of the first light-emitting unit 201 and the second light-emitting unit 202 of the touch display device of the disclosure. However, the number and arrangement of the first light-emitting unit 201 and the second light-emitting unit 202 are not limited thereto. The number and arrangement of the first light-emitting unit 201 and the second light-emitting unit 202 may be appropriately changed according to actual requirements, so as to achieve the required sensing resolution. In addition, in the foregoing embodiments, the size and the spacing of the first light-emitting units 201 and the second light-emitting units 202 may be the same or different, so as to provide different displays and sensing resolutions to meet design requirements of different display regions.

Figure 5A:
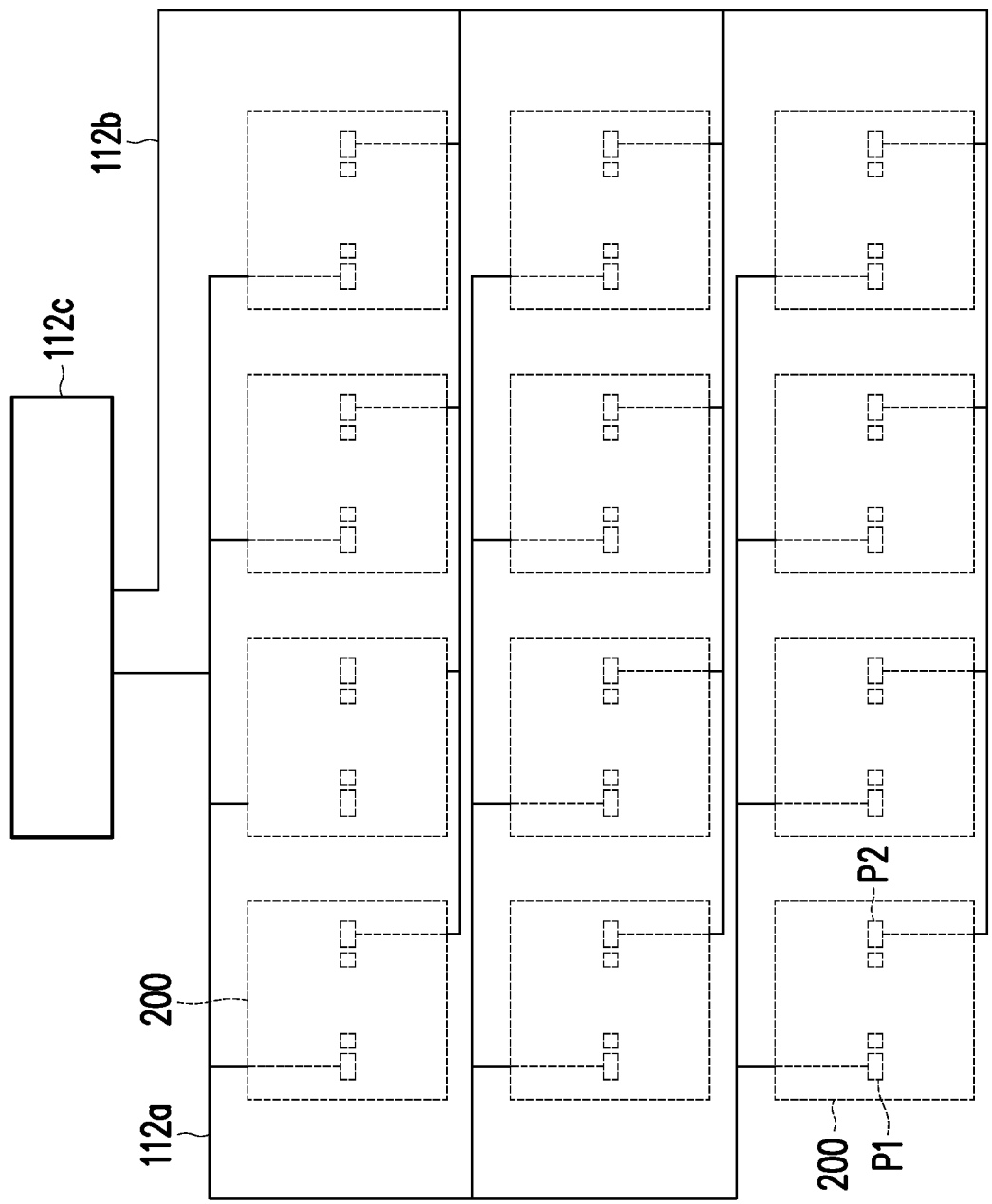
FIG. 5a is a schematic view of the layout of a light-emitting transmission circuit of the touch display device according to an embodiment of the disclosure.

FIG. 5a is a schematic view of the layout of a light-emitting transmission circuit of the touch display device according to an embodiment of the disclosure. In the embodiment, s light-emitting transmission circuit 310 may be, for example, disposed in the transmission circuit layer 110 described in FIGS. 1b and 1c. Here, as an example, the light-emitting transmission circuit 310 is illustrated as being disposed in the first conductive layer 112 in FIG. 1c, but it is not limited thereto. The light-emitting transmission circuit 310 may include a positive electrode transmission circuit 112a and a negative electrode transmission circuit 112b. The positive electrode transmission circuit 112a and the negative electrode transmission circuit 112b are electrically separated, and the positive electrode transmission circuit 112a and the negative electrode transmission circuit 112b are both connected to a LED drive element 112c.

With reference to FIGS. 5a and 1b concurrently, as described in the foregoing embodiment, the light-emitting circuit 214 of the light-emitting unit 200 is connected to the light-emitting transmission circuit 310 in the transmission circuit layer 110. Specifically, the light-emitting unit 200 may also be equipped with a first pad P1 and a second pad P2. The positive electrode transmission circuit 112a and the negative electrode transmission circuit 112b are respectively connected to the first pad P1 and the second pad P2. In this way, a driving signal from the LED drive element 112c may be transported to the LED crystal grain 212 via the positive electrode transmission circuit 112a, the first pad P1, and the positive electrode circuit 214a, and transported to the LED crystal grain 212 via the negative electrode transmission circuit 112b, the second pad P2, and the negative electrode circuit 214b, so as to drive the LED crystal grain 212 to emit light.

Figure 5B:
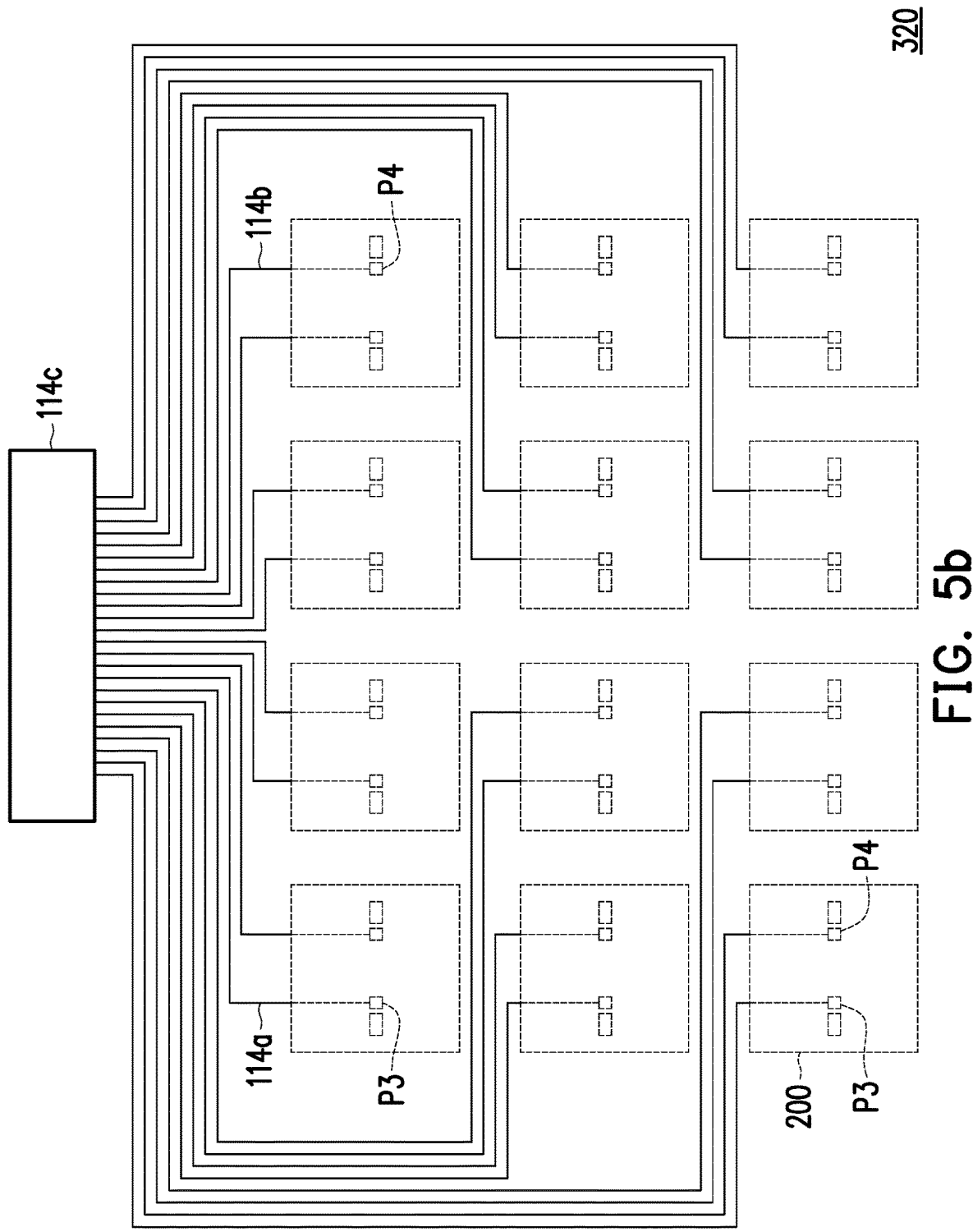
FIG. 5b is a schematic view of the layout of a sensing transmission circuit of the touch display device according to an embodiment of the disclosure.

FIG. 5b is a schematic view of the layout of a sensing transmission circuit of the touch display device according to an embodiment of the disclosure. In the embodiment, a sensing transmission circuit 320 may be, for example, disposed in the transmission circuit layer 110 described in FIGS. 1*b* and 1*c*. Here, as an example, the sensing transmission circuit 320 is illustrated as being disposed in the second conductive layer 114 in FIG. 1*c*, but it is not limited thereto. The sensing transmission circuit 320 may include a transport transmission circuit 114*a* and a receiving transmission circuit 114*b*. The transport transmission circuit 114*a* and the receiving transmission circuit 114*b* are electrically separated, and the transport transmission circuit 114*a* and the receiving transmission circuit 114*b* are both connected to a sensing drive element 114*c*.

With reference to FIG. 5*b* and FIG. 1*b* concurrently, as described in the foregoing embodiment, the sensing circuit 224 of the light-emitting unit 200 is connected to the sensing transmission circuit 320 in the transmission circuit layer 110. Specifically, the light-emitting unit 200 may also be equipped with a third pad P3 and a fourth pad P4. The transport electrode (Tx) 222*a* and the receiving electrode (Rx) 222*b* of the sensing element 220 may be respectively connected to the third pad P3 and the fourth pad P4 via the transport circuit 224*a* and the receiving circuit 224*b*. After the transport transmission circuit 114*a* and the receiving transmission circuit 114*b* are respectively connected to the third pad P3 and the fourth pad P4, the driving signal from the sensing drive element 114*c* may be transported to the transport electrode (Tx) 222*a* of the sensing element 220 via the transport transmission circuit 114*a*, the third pad P3, and the transport circuit 224*a*, and be transported to the receiving electrode (Rx) 222*b* of the sensing element 220 via the receiving transmission circuit 114*b*, the fourth pad P4 and the receiving circuit 224*b*, so as to drive the sensing element 220 for sensing.

In summary, the touch display device of the disclosure integrates the sensing element into the light-emitting unit, so that the sensing element is located between the light-emitting element and the substrate, and the orthographic projection of the sensing element on the substrate overlaps the orthographic projection of the light-emitting element on the substrate. In this way, the thickness of the light-emitting unit having the sensing function will not increase, that is, realizing the touch function while achieving the thinning of the touch display device. In addition, the touch display device of the disclosure integrates the sensing element into the light-emitting unit, and the sensing resolution may be determined by adjusting the spacings between the light-emitting units. For example, a touch region and a touch sensing resolution may be determined by the arrangement of the first/second light-emitting unit with/without the sensing element, and any faulty light-emitting unit may be replaced separately without the need to scrap the entire touch display device.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A touch display device, comprising:
a substrate; and
a plurality of light-emitting units, bonded to the substrate, wherein each of the plurality of light-emitting units comprises at least one light-emitting element, and a first light-emitting unit of the plurality of light-emitting units comprises at least one sensing element, wherein in the first light-emitting unit, the at least one sensing element is located between the at least one light-emitting element and the substrate, and an orthographic projection of the at least one sensing element on the substrate overlaps an orthographic projection of the at least one light-emitting element on the substrate;
wherein each of the at least one light-emitting element comprises an LED crystal grain and a light-emitting circuit, each of the at least one sensing element comprises a sensing electrode and a sensing circuit, and the light-emitting circuit and the sensing circuit are electrically separated, and
wherein the substrate further comprises a light-emitting transmission circuit and a sensing transmission circuit, the light-emitting transmission circuit and the sensing transmission circuit are electrically separated, the light-emitting transmission circuit is connected to the light-emitting circuit, and the sensing transmission circuit is connected to the sensing circuit.

2. The touch display device according to claim 1, wherein the each of the plurality of light-emitting units is the first light-emitting unit.

3. The touch display device according to claim 1, wherein the first light-emitting unit comprises a plurality of light-emitting elements, and a number of the at least one sensing element is one, and orthographic projections of the plurality of light-emitting elements on the substrate overlap the orthographic projection of the sensing element on the substrate.

4. The touch display device according to claim 1, wherein a second light-emitting unit of the plurality of light-emitting units does not comprise a sensing element.

5. The touch display device according to claim 4, wherein the first light-emitting unit is disposed at a central region of the substrate, while the second light-emitting unit is disposed at a peripheral region of the substrate, and the peripheral region surrounds the central region.

6. The touch display device according to claim 1, wherein the first light-emitting unit comprises a plurality of light-emitting elements, and an orthographic projection of a first light-emitting element of the plurality of light-emitting elements on the substrate overlaps the orthographic projection of the at least one sensing element on the substrate.

7. The touch display device according to claim 6, wherein an orthographic projection of a second light-emitting element of the plurality of light-emitting elements on the substrate does not overlap the orthographic projection of the at least one sensing element on the substrate.

8. The touch display device according to claim 7, wherein the first light-emitting element is disposed at a central region of the first light-emitting unit, while the second light-emitting element is disposed at a peripheral region of the first light-emitting unit, and the peripheral region surrounds the central area.

9. The touch display device according to claim 7, wherein numbers of the first light-emitting element and the second light-emitting element are respectively in plurality, and the plurality of first light-emitting elements and the plurality of second light-emitting elements are in a staggered disposition.

10. The touch display device according to claim 1, wherein the each of the plurality of light-emitting units further comprises a carrier board, the carrier board is bonded to the substrate, and the at least one light-emitting element and the at least one sensing element are disposed at the corresponding carrier board.

11. The touch display device according to claim 1, wherein the light-emitting circuit comprises a positive electrode circuit and a negative electrode circuit, and the positive electrode circuit and the negative electrode circuit are electrically separated.

12. The touch display device according to claim 1, wherein the sensing electrode comprises a transport electrode and a receiving electrode, and the transport electrode and the receiving electrode are electrically separated.

13. The touch display device according to claim 12, wherein the transport electrode and the receiving electrode are both disposed parallel to a surface of the substrate.

14. The touch display device according to claim 12, wherein the transport electrode and the receiving electrode are both disposed perpendicular to a surface of the substrate.

15. The touch display device according to claim 1, wherein the LED crystal grain comprises a micro LED crystal grain, a mini LED crystal grain, or a combination of the above.

* * * * *